(12) United States Patent
Chang et al.

(10) Patent No.: US 9,691,668 B2
(45) Date of Patent: Jun. 27, 2017

(54) WAFER CARRIER

(71) Applicant: EPISTAR CORPORATION, Hsinchu (TW)

(72) Inventors: Chung-Ying Chang, Hsinchu (TW); Yun-Ming Lo, Hsinchu (TW); Chi Shen, Hsinchu (TW); Ying-Chan Tseng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/649,445

(22) Filed: Oct. 11, 2012

(65) Prior Publication Data

US 2013/0092595 A1    Apr. 18, 2013

(30) Foreign Application Priority Data

Oct. 14, 2011  (TW) .............................. 100137510 A

(51) Int. Cl.
| | | |
|---|---|---|
| H01L 21/67 | (2006.01) | |
| H01L 21/687 | (2006.01) | |
| H01L 21/66 | (2006.01) | |
| H01L 21/683 | (2006.01) | |
| C23C 16/458 | (2006.01) | |

(52) U.S. Cl.
CPC .......... *H01L 22/12* (2013.01); *C23C 16/4585* (2013.01); *H01L 21/683* (2013.01); *H01L 21/67* (2013.01)

(58) Field of Classification Search
CPC ............. H01L 21/67309; H01L 21/683; H01L 21/677; H01L 21/477; H01L 21/67; H01L 21/6732; H01L 21/67138; C30B 25/12; C30B 35/00; C23C 16/4581; C23C 16/4583
USPC ........ 206/710, 711, 832, 712; 118/728, 724; 438/680; 269/289 R; 279/128
See application file for complete search history.

(56) References Cited

U.S. PATENT DOCUMENTS

| | | | | | |
|---|---|---|---|---|---|
| 3,482,682 | A | * | 12/1969 | Cronkhite | 206/712 |
| 3,539,759 | A | * | 11/1970 | Spiro et al. | 219/634 |
| 3,672,495 | A | * | 6/1972 | Bauer et al. | 206/712 |
| 3,719,273 | A | * | 3/1973 | Abe | 206/712 |
| 4,355,974 | A | * | 10/1982 | Lee | 432/253 |
| 4,653,636 | A | * | 3/1987 | Armstrong | 206/711 |
| 4,767,005 | A | * | 8/1988 | Onuma et al. | 206/710 |
| 4,886,162 | A | * | 12/1989 | Ambrogio | 206/710 |
| 5,169,684 | A | * | 12/1992 | Takagi | 427/248.1 |

(Continued)

*Primary Examiner* — Mickey Yu
*Assistant Examiner* — Gideon Weinerth
(74) *Attorney, Agent, or Firm* — Patterson + Sheridan, LLP

(57) ABSTRACT

A wafer carrier comprises a supporting body having an opening therein, wherein said opening in said supporting body has a concave sidewall and a bottom surface in said supporting body which is curved in cross section; a plurality of vertical supporting rods configured to support and contact a wafer received in said opening and to displace said wafer from the bottom surface of the opening in said supporting body; wherein one of said supporting rods has an end for contacting and supporting said wafer; and wherein when viewing from a top view of the wafer carrier, one of said supporting rods has a base lining on the concave sidewall of said opening in said supporting body, a first concave side opposite to the base and two second concave sides connecting the base and the first concave side.

16 Claims, 6 Drawing Sheets

(56) References Cited

U.S. PATENT DOCUMENTS

| | | | |
|---|---|---|---|
| 5,242,501 A * | 9/1993 | McDiarmid | 118/728 |
| 5,284,802 A * | 2/1994 | Muraoka et al. | 438/708 |
| 5,474,177 A * | 12/1995 | Abrams et al. | 206/710 |
| 5,474,612 A * | 12/1995 | Sato et al. | 118/725 |
| 5,534,074 A * | 7/1996 | Koons | 118/728 |
| 5,577,621 A * | 11/1996 | Yi | 211/41.18 |
| 5,584,936 A * | 12/1996 | Pickering et al. | 118/728 |
| 5,586,880 A * | 12/1996 | Ohsawa | 432/241 |
| 5,752,609 A * | 5/1998 | Kato et al. | 211/41.18 |
| 5,890,598 A * | 4/1999 | Hayashida et al. | 206/710 |
| 6,287,112 B1 * | 9/2001 | Van Voorst Vader et al. | 432/258 |
| 6,341,935 B1 * | 1/2002 | Tseng | 414/800 |
| 6,357,432 B2 * | 3/2002 | Zehavi et al. | 125/12 |
| 6,361,313 B1 * | 3/2002 | Beyaert et al. | 432/259 |
| 6,395,363 B1 * | 5/2002 | Ballance et al. | 428/64.1 |
| 6,915,906 B2 * | 7/2005 | Pylant et al. | 206/710 |
| 7,077,913 B2 * | 7/2006 | Shimada | 118/725 |
| 7,256,375 B2 * | 8/2007 | Oosterlaken | 219/634 |
| 7,431,162 B2 * | 10/2008 | Forsyth | 206/710 |
| 7,455,734 B2 * | 11/2008 | Yamaguchi et al. | 118/728 |
| 7,530,462 B2 * | 5/2009 | Yajima et al. | 206/710 |
| 7,591,908 B2 * | 9/2009 | Kanaya et al. | 118/728 |
| D616,391 S * | 5/2010 | Sato | D13/182 |
| 7,971,734 B2 * | 7/2011 | De Ridder et al. | 211/41.18 |
| 8,323,411 B2 * | 12/2012 | Loo | 118/728 |
| 8,728,939 B2 * | 5/2014 | Maeda et al. | 438/678 |
| 8,800,774 B2 * | 8/2014 | Bonora | 206/710 |
| 2002/0092602 A1 * | 7/2002 | Saito et al. | 156/153 |
| 2003/0057089 A1 * | 3/2003 | Nguyen | 204/298.15 |
| 2003/0075434 A1 * | 4/2003 | Voser et al. | 204/241 |
| 2004/0124594 A1 * | 7/2004 | Muto et al. | 279/128 |
| 2004/0187790 A1 * | 9/2004 | Bader et al. | 118/728 |
| 2006/0144752 A1 * | 7/2006 | Forsyth | 206/710 |
| 2006/0180086 A1 * | 8/2006 | Kanaya et al. | 118/728 |
| 2007/0006803 A1 * | 1/2007 | Cadwell et al. | 117/200 |
| 2007/0089836 A1 * | 4/2007 | Metzner et al. | 156/345.51 |
| 2008/0132032 A1 * | 6/2008 | Tomita et al. | 438/455 |
| 2008/0314319 A1 * | 12/2008 | Hamano et al. | 118/728 |
| 2009/0007841 A1 * | 1/2009 | Hirata et al. | 117/84 |
| 2009/0277387 A1 | 11/2009 | Jung et al. | |
| 2010/0044974 A1 * | 2/2010 | Kenworthy et al. | 279/128 |
| 2011/0049779 A1 * | 3/2011 | Egami et al. | 269/289 R |
| 2011/0129947 A1 | 6/2011 | Mangum et al. | |
| 2011/0209660 A1 * | 9/2011 | Myo et al. | 117/88 |
| 2012/0028440 A1 * | 2/2012 | Castex et al. | 438/459 |
| 2012/0146191 A1 * | 6/2012 | Yasuhara et al. | 257/615 |
| 2012/0244703 A1 * | 9/2012 | Nakayama et al. | 438/680 |
| 2013/0263776 A1 * | 10/2013 | Pitney et al. | 117/85 |
| 2014/0030048 A1 * | 1/2014 | Kosuge et al. | 414/225.01 |
| 2014/0113458 A1 * | 4/2014 | Pan et al. | 438/795 |
| 2014/0300064 A1 * | 10/2014 | Inaba et al. | 279/128 |

* cited by examiner

WAFER CARRIER

TECHNICAL FIELD

The application relates to a wafer carrier, and more particularly, to a wafer carrier having a supporting body and a plurality of supporting rods formed around a periphery of the supporting body.

REFERENCE TO RELATED APPLICATION

This application claims the right of priority based on Taiwan application Serial No. 100137510, filed on Oct. 14, 2011, and the content of which is hereby incorporated by reference in its entirety.

DESCRIPTION OF BACKGROUND ART

In the manufacturing of a light-emitting diode (LED), an epitaxial layer is grown on a substrate. The substrate functions as a seed layer. When the lattice constant of the substrate is similar to the lattice constant of the epitaxial layer, a defect such as dislocation between the epitaxial layer and the substrate can be reduced. When the epitaxial layer is formed on the substrate, a stress is formed between the epitaxial layer and the substrate under different temperature regions of the reactor furnace. The stress affects the epitaxial quality of the epitaxial layer, and the stress may result in warp in the epitaxial layer. Thus, the material of the substrate is preferably similar to the material of the epitaxial layer. Because of the similar physical characteristics, such as the lattice constant, of the substrate and the epitaxial layer, the stress can be reduced. However, for some epitaxial layers, there is no suitable substrate available for use, neither the same material as the epitaxial layer, nor the same lattice constant as the epitaxial layer. Further, in consideration of the cost of the production, there may be no suitable substrate available.

Based on the reasons described above, once the material of the substrate and the material of the epitaxial layer are different, one or more materials of the epitaxial layer is different from the material of the substrate when the epitaxial layer is composed of a plurality of materials, or the lattice constant, the thermal expansion coefficient or the hardness of the epitaxial layer is different from that of the substrate, which results in different degrees of stress between the substrate and the epitaxial layer at different temperatures of the reactor furnace when the epitaxial layer is formed on the substrate. The stress may result in different degrees of curvature or warp. Mild stress may result in uneven heating of the epitaxial layer, which further results in poor epitaxial quality. The bending caused by the epitaxial layer warp also impacts the following process. However, if the stress is too large, the epitaxial layer may rupture.

The growth method of the epitaxial layer of the light emitting diode comprises vapor phase epitaxy (VPE) or metal organic chemical vapor deposition (MOCVD). The metal organic chemical vapor deposition (MOCVD) method is most commonly used to grow the epitaxial layer, such as GaN or AlGaInP. First, a substrate is disposed on a wafer carrier. After that, an epitaxial layer is formed on the substrate to form a wafer structure in a reactor furnace. The temperature of the reactor furnace changes continually during the formation of the epitaxial layer. Because the lattice constants or the thermal expansion coefficients of the epitaxial layer and the substrate are different from each other, the wafer structure has different degrees of curvature or warp in different temperature regions.

When the wafer structure is bowed, the wafer cannot contact with the wafer carrier closely, which results in uneven temperature distribution across the whole wafer surface. If the light-emitting layer is grown on the wafer, the light-emitting wavelength distribution range across the whole wafer is large.

FIG. 1 illustrates a conventional wafer carrier 10. The wafer carrier 10 comprises a carrier body 100 having an opening 102. A bottom surface 103 of the opening 102 is a flat surface. A wafer 104 comprises a growth substrate and an epitaxial layer grown on the growth substrate, and the epitaxial layer comprises a light-emitting layer. When the epitaxial layer is grown on the growth substrate, the furnace temperature is changed continually. Due to the lattice constants and the thermal expansion coefficients of the epitaxial layer and the growth substrate are different from each other, different degrees of curvature and warp are produced on the wafer in different temperature regions. As shown in FIG. 1, the wafer 104 is convex warp in a cross-sectional view. When the light-emitting layer is grown on the growth substrate, only partial surface of the wafer 104 is contacted with the bottom surface 103 of the opening 102 of the wafer carrier 10. When the reactor furnace temperature for the growth of the light emitting layer is set at a value by considering the condition of the center area of the wafer 104, the growth temperature of the edge of the wafer 104 is different from the growth temperature of the center of the wafer 104. Because the growth temperature varies with different regions of the wafer 104, the light-emitting wavelengths of different regions of the wafer 104 are also different.

FIG. 2 illustrates a conventional wafer carrier 20. The wafer carrier 20 comprises a carrier body 200 having an opening 202. A bottom surface 203 of the opening 202 is a flat surface. A wafer 204 comprises a growth substrate and an epitaxial layer grown on the growth substrate, and the epitaxial layer comprises a light-emitting layer. As illustrated in FIG. 2, the wafer 204 is concave warp in a cross-sectional view. When the light-emitting layer is grown on the growth substrate, only partial surface of the wafer 204 is contacted with the bottom surface 203 of the opening 202 of the wafer carrier 20. The wafer 204 is shaken easily and may fly out when the wafer carrier 20 is rotated at high speed.

FIG. 3A illustrates a conventional wafer carrier 30. The wafer carrier 30 comprises a carrier body 300 having an opening 302, wherein a bottom surface 303 of the opening 302 is a flat surface; and a supporting ring 305 provided around a periphery of the carrier body 300. A wafer 304 comprises a growth substrate and an epitaxial layer grown on the growth substrate, and the epitaxial layer comprises a light-emitting layer.

FIG. 3B illustrates a top view of the conventional wafer carrier 30. As illustrated in FIG. 3B, the top view of the supporting ring 305 is approximately a circular shape. The supporting ring 305 supports the wafer 304 around a periphery of the wafer 304 and the wafer 304 is not shaken easily. But the temperature of the wafer periphery contacted directly with the supporting ring 305 and the temperature of the wafer center not directly contacted with the supporting ring 305 are different, which results in different growth temperatures in different regions of the wafer 304 when the light-emitting layer is grown on the growth substrate.

SUMMARY OF THE APPLICATION

A wafer carrier comprises a supporting body having a height and comprising an opening, wherein a bottom surface of the opening is a curved surface; and a plurality of supporting rods formed around a periphery of the supporting body. Another aspect of the present application provides a manufacturing method of the wafer carrier. The method comprises forming an epitaxial layer on a growth substrate to form a wafer structure; measuring a curvature radius of the wafer structure; and providing the wafer carrier described above in accordance with the curvature radius of the wafer structure.

A wafer carrier comprises a supporting body having an opening therein, wherein said supporting body has a concave sidewall and a bottom surface in said supporting body which is curved in cross section: a plurality of supporting rods configured to support and contact a wafer received in said opening and to displace said wafer from the bottom surface of the opening in said supporting body; wherein one of said supporting rods has an end for contacting and supporting said wafer; and wherein when viewing from a top view of the wafer carrier, one of said supporting rods has a base lining on the concave sidewall of said opening in said supporting body, a first concave side opposite to the base and two second concave sides connecting the base and the first concave side.

DETAILED DESCRIPTION OF PREFERRED EMBODIMENTS

Figure 1:
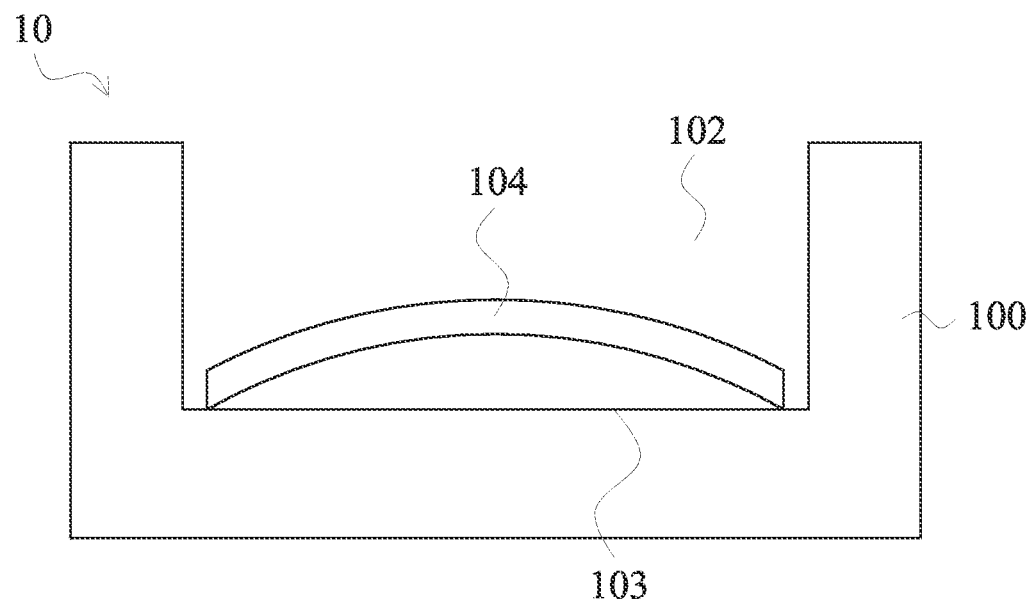
FIG. 1 illustrates a cross-sectional view of a conventional wafer carrier.
Figure 2:
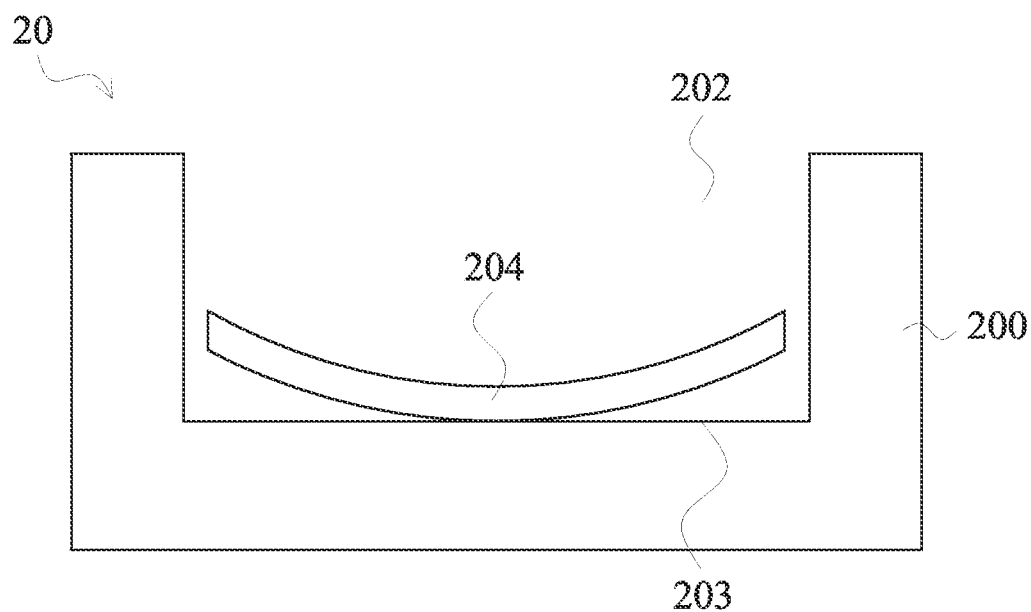
FIG. 2 illustrates a cross-sectional view of a conventional wafer carrier.
Figure 3A:
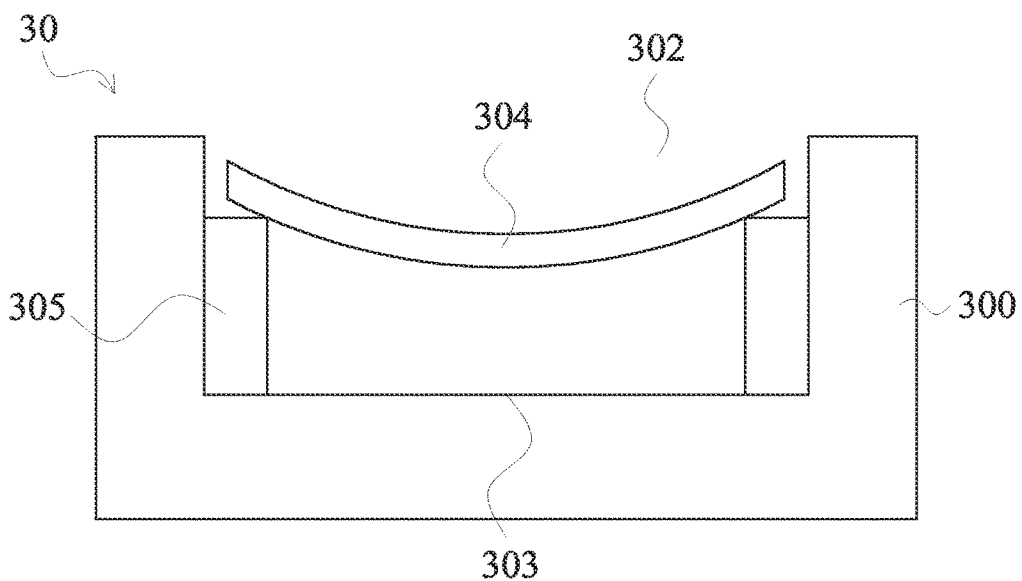
FIG. 3A illustrates a cross-sectional view of a conventional wafer carrier.
Figure 3B:
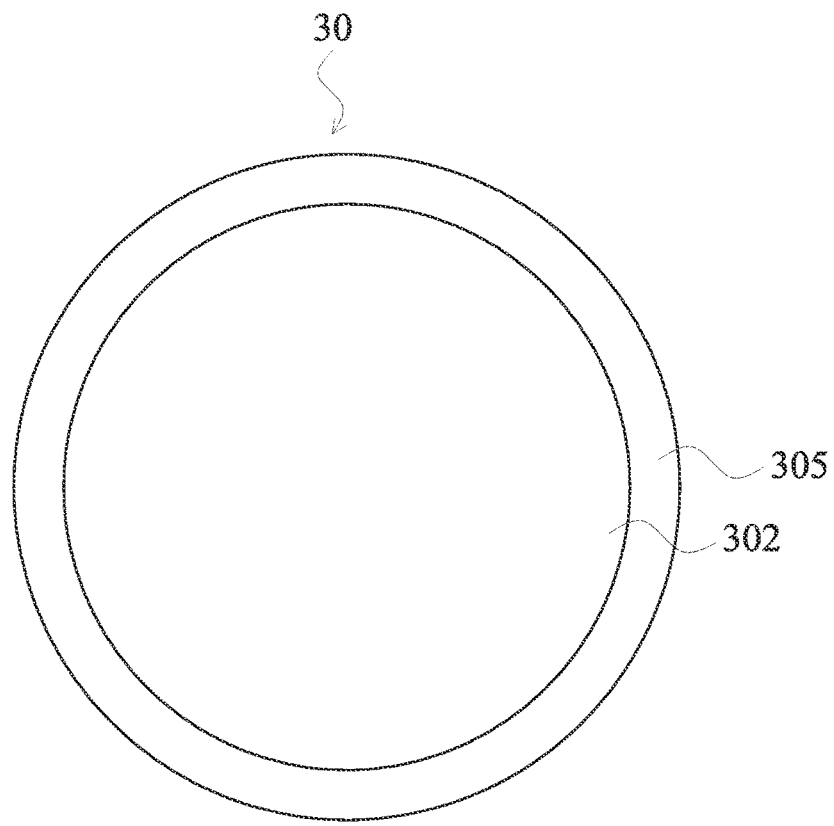
FIG. 3B illustrates a top view of a conventional wafer carrier.

The embodiment of the application is illustrated in detail, and is plotted in the drawings. The same or the similar part is illustrated in the drawings and the specification with the same number.

It should be noted that an expression of an element or a material layer being formed or connected to another element or another material layer comprises the element or the material layer being directly or indirectly formed or connected to another element or another material layer, that is to say other elements or material layers can be formed there between. If the present application describes an element or a material layer being directly formed or connected to another element or material layer, that is to say no other elements or material layers are formed there between.

Figure 4A:
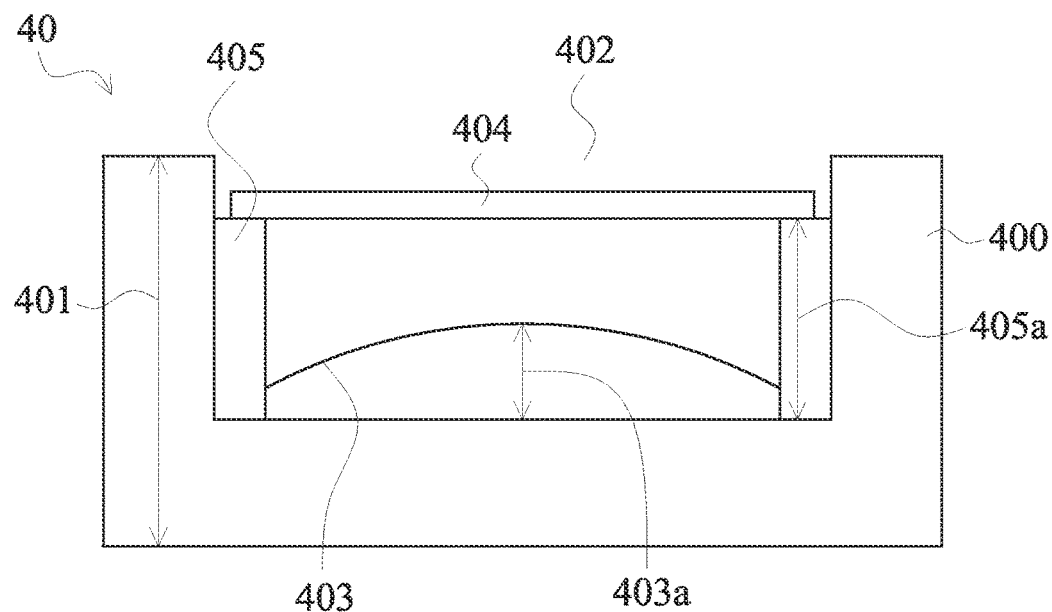
FIG. 4A illustrates a cross-sectional view of a wafer carrier in accordance with a first embodiment of the present application.

FIG. 4A illustrates a cross-sectional view of a wafer carrier 40 in accordance with a first embodiment of the present application. As shown in FIG. 4A, the wafer carrier 40 comprises a supporting body 400 having a height 401; and a plurality of supporting rods 405 formed around a periphery of the supporting body 400. The supporting body 400 comprises an opening 402, wherein a bottom surface 403 of the opening 402 is a curved surface.

Figure 8A:
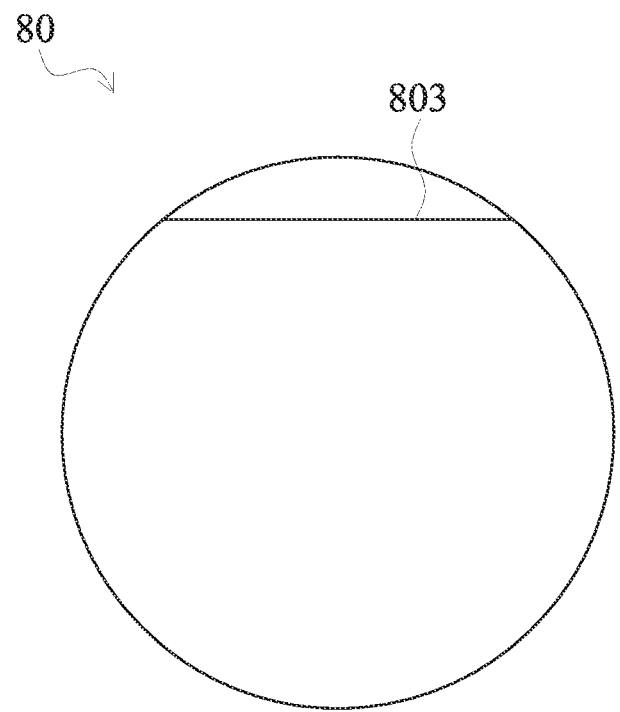
FIG. 8A illustrates a top view of a wafer carrier comprising a flat edge in accordance with an embodiment of the present application.

A top view of the opening 402 of the wafer carrier 40 is approximately a circle shape. The opening 402 can accommodate a commercial wafer having a diameter between 2 in and 8 in. The top view of the wafer carrier 40 can be referred to FIG. 8A. FIG. 8A illustrates a top view of a wafer carrier 80 in accordance with an embodiment of the present application. If the wafer carrier 80 is used to support a wafer having a diameter of 4 in or above, the top view of the opening (not shown) of the wafer carrier 80 further comprises a flat edge 803. As shown in FIG. 4A, a wafer 404 comprises a growth substrate and an epitaxial layer formed on the growth substrate, and the epitaxial layer comprises a light-emitting layer. The material of the epitaxial layer comprises an element selected from a group consisting of Gallium (Ga), aluminum (Al), indium (In), phosphorus (P), nitrogen (N), zinc (Zn), cadmium (Cd) and selenium (Se).

The material of the supporting body 400 comprises composite material, such as ceramic material; semiconductor material, such as boron nitride (BN) or silicon carbide (SiC); conductive material, such as graphite or metal, wherein the metal comprises molybdenum (Mo), tungsten (W), titanium (Ti), zirconium (Zr) or the combination thereof; or non-conductive material, such as quartz.

In accordance with the first embodiment of the present application, the top view of the opening 402 is approximately a circle shape, wherein the top view of the opening 402 comprises a side and a center. The bottom surface 403 of the opening 402 is a curved surface and the curved surface is a convex surface, wherein the center of the opening 402 has a height 403a protruding from the side of the opening 402. The height 403a of the convex surface can be between 15 µm and 1000 µm. The height 403a of the convex surface is proportional to the diameter of the wafer 404 supported by the wafer carrier 40, and a ratio between the diameter of the wafer 404 and the height 403a of the convex surface is between 7 and 125. When the epitaxial layer is formed on the growth substrate to form the wafer 404 at high temperature, the wafer 404 is bowed easily. The larger the diameter of the wafer 404 is, the more easily bowed the wafer 404 is. Thus, the height 403a of the convex surface is increased accompanied with the increase of the diameter of the wafer 404. In an embodiment, the diameter of the wafer 404 is 2 in, and the height 403a of the convex surface of the supporting body 400 can be between 15 µm and 65 µm. In another embodiment, the diameter of the wafer 404 is 4 in, and the height 403a of the convex surface of the supporting body 400 can be between 15 µm and 160 µm. In another embodiment, the diameter of the wafer 404 is 6 in, the height 403a of the convex surface of the supporting body 400 can be between 15 µm and 400 µm. In another embodiment, the diameter of the wafer 404 is 8 in, the height 403a of the convex surface of the supporting body 400 can be between 15 µm and 1000 µm.

Because the lattice constants or the thermal expansion coefficients of the epitaxial layer and the growth substrate are different from each other, the warp degree and the warp shape of the wafer are different in different temperature regions. When the warp shape of the wafer is a convex surface, the wafer carrier 40 having the convex surface is preferably provided, which results in more even temperature distribution across the wafer surface, and more even distribution of the light-emitting wavelength of the light-emitting layer across the whole wafer.

Figure 6:
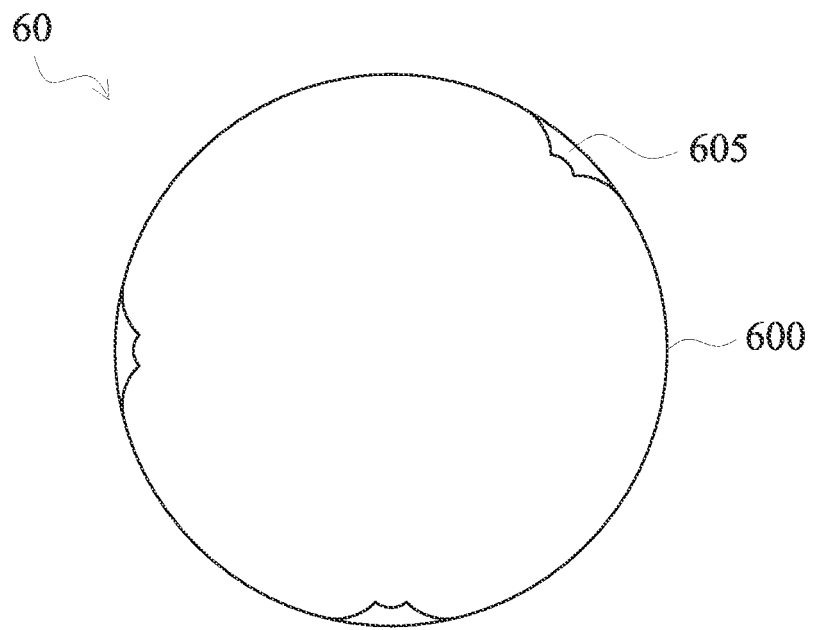
FIG. 6 illustrates a top view of a wafer carrier in accordance with an embodiment of the present application.

In accordance with the first embodiment of the present application, the wafer carrier 40 further comprises the plurality of supporting rods 405 formed around the periphery of the supporting body 400. In the embodiment, there are at least three supporting rods 405. The top view of the plurality of supporting rods 405 formed around the periphery of the supporting body 400 can be referred to FIG. 6. FIG. 6 illustrates a top view of a wafer carrier 60 in accordance with an embodiment of the present application. As illustrated in FIG. 6, there are at least three supporting rods 605, and the plurality of supporting rods 605 is formed around the periphery of the supporting body 600.

Figure 7:
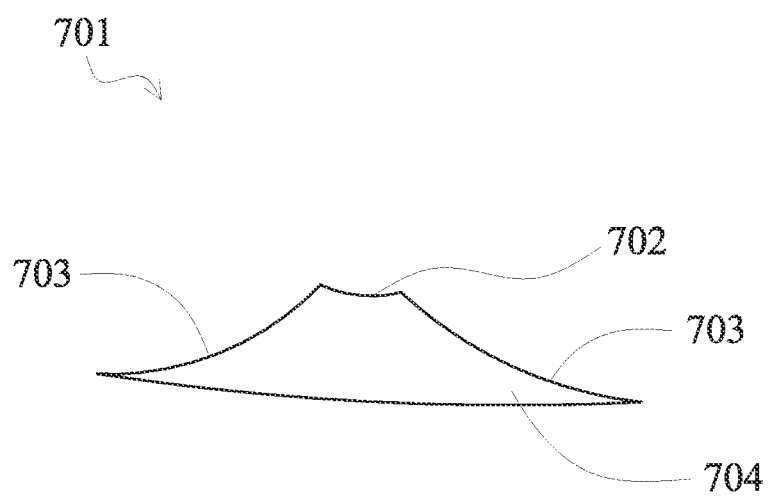
FIG. 7 illustrates a top view of each supporting rod of a wafer carrier in accordance with an embodiment of the present application.

A top view of each supporting rod 405 can be referred to FIG. 7. FIG. 7 illustrates a top view of each supporting rod 704 of a wafer carrier 701 in accordance with an embodiment of the present application. Each supporting rod 704 comprises a first side 702 and a plurality of second sides 703, wherein the first side 702 comprises a first arc surface having a first curvature radius, and each of the plurality of second sides 703 comprises a second arc surface having a second curvature radius, wherein the second curvature radius is not equal to the first curvature radius.

As illustrated in FIG. 4A, each of the plurality of supporting rods 405 comprises a height 405a smaller than the height 401 of the supporting body 400. The height 405a of each of the plurality of supporting rods 405 is larger than the height 403a of the convex surface of the supporting body 400. The height 405a of the supporting rod 405 can be between 15 μm and 1000 μm. The material of the plurality of supporting rods 405 comprises composite material, such as ceramic material; semiconductor material, such as boron nitride (BN) or silicon carbide (SiC); conductive material, such as graphite or metal, wherein the metal comprises molybdenum (Mo), tungsten (W), titanium (Ti), zirconium (Zr) or the combination thereof; or non-conductive material, such as quartz.

Figure 4B:
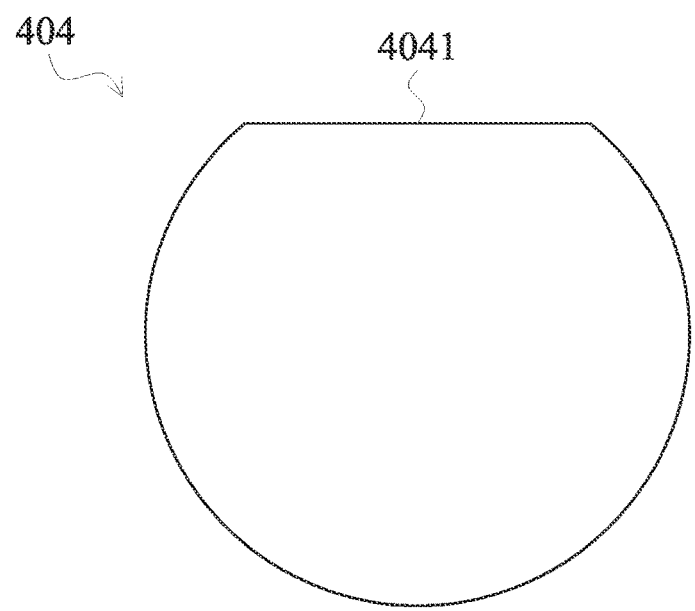
FIG. 4B illustrates a top view of a wafer in accordance with a first embodiment of the present application.
Figure 8B:
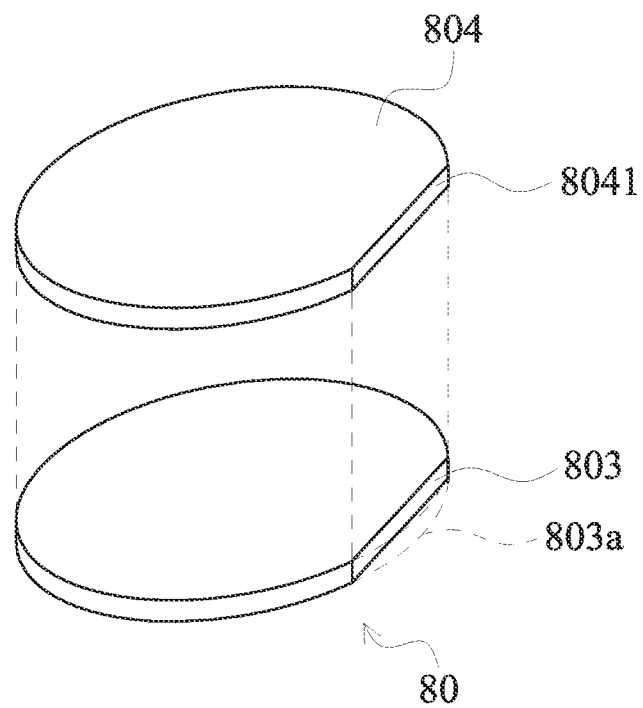
FIG. 8B illustrates a top view of a wafer and a wafer carrier in accordance with an embodiment of the present application.

FIG. 4B illustrates a top view of the wafer 404 in accordance with an embodiment of the present application. The wafer 404 comprises a flat edge 4041. As illustrated in FIG. 4A, after the wafer 404 is supported by the plurality of supporting rods 405, the wafer 404 cannot directly contact with the bottom surface 403 of the wafer carrier 40. Thus, it is not easy to heat the wafer 404, especially the flat edge 4041, and that impacts the light-emitting wavelength emitted from the light-emitting layer of the wafer 404. This phenomenon is more pronounced accompanied with increasing the diameter of the wafer 404. FIG. 8A illustrates the top view of the wafer carrier 80 comprising the flat edge 803. FIG. 8B illustrates the top view of the wafer carrier 80 comprising the flat edge 803 and the wafer 804 comprising a flat edge 8041. As illustrated in FIG. 8A and FIG. 8B, when the wafer carrier 80 comprises the flat edge 803, a gap 803a between a flat edge 8041 of a wafer 804 and the flat edge 803 of the wafer carrier 80 is reduced, and that improves the heating uniformity. In accordance with the embodiment illustrated in FIG. 8B, when the wafer carrier 40 is used to support the wafer 404 having a diameter of 4 in or above and the flat edge 4041, the wafer carrier 40 preferably comprises a flat edge.

Figure 5A:
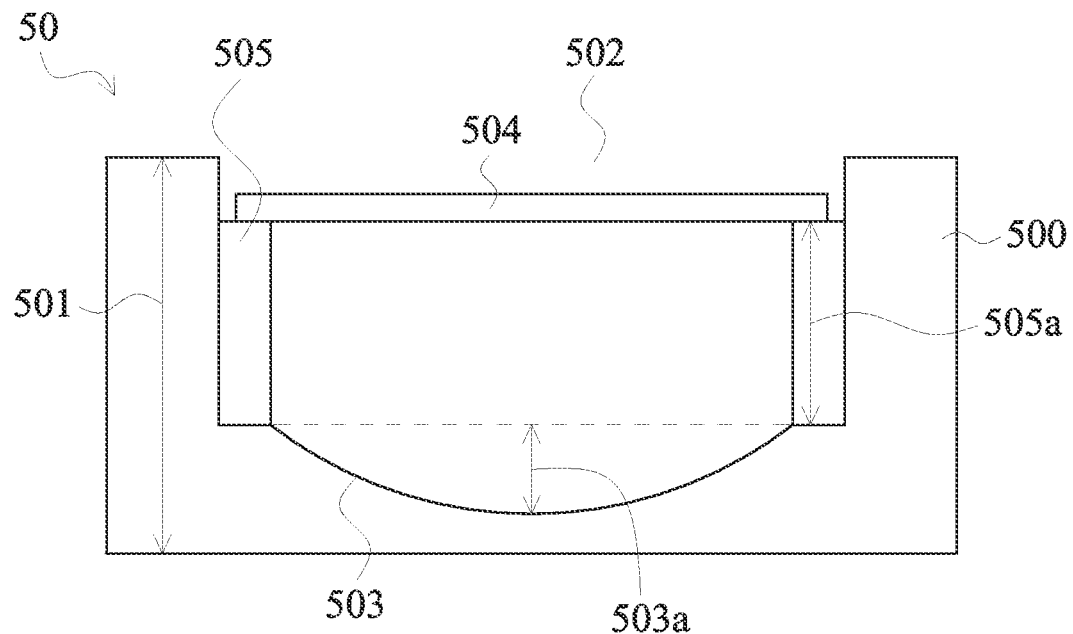
FIG. 5A illustrates a cross-sectional view of a wafer carrier in accordance with a second embodiment of the present application.

FIG. 5A illustrates a cross-sectional view of a wafer carrier 50 in accordance with a second embodiment of the present application. As shown in FIG. 5A, the wafer carrier 50 comprises a supporting body 500 having a height 501; and a plurality of supporting rods 505 formed around a periphery of the supporting body 500. The supporting body 500 comprises an opening 502, wherein a bottom surface 503 of the opening 502 is a curved surface.

A top view of the opening 502 of the wafer carrier 50 is approximately a circle shape. The opening 502 can accommodate a commercial wafer having a diameter between 2 in and 8 in. The top view of the wafer carrier 50 can be referred to FIG. 8A. FIG. 8A illustrates a top view of a wafer carrier 80 in accordance with an embodiment of the present application. If the wafer carrier 80 is used to support a wafer having a diameter of 4 in or above, the top view of the opening (not shown) of the wafer carrier 80 further comprises a flat edge 803. As shown in FIG. 5A, a wafer 504 comprises a growth substrate and an epitaxial layer formed on the growth substrate, wherein the epitaxial layer comprises a light-emitting layer. The material of the epitaxial layer comprises an element selected from a group consisting of Gallium (Ga), aluminum (Al), indium (In), phosphorus (P), nitrogen (N), zinc (Zn), cadmium (Cd) and selenium (Se).

The material of the supporting body 500 comprises composite material, such as ceramic material; semiconductor material, such as boron nitride (BN) or silicon carbide (SiC); conductive material, such as graphite or metal, wherein the metal comprises molybdenum (Mo), tungsten (W), titanium (Ti), zirconium (Zr) or the combination thereof; or non-conductive material, such as quartz.

In accordance with the second embodiment of the present application, the top view of the opening 502 is approximately a circle shape, wherein the top view of the opening 502 comprises a side and a center. The bottom surface 503 of the opening 502 is a curved surface and the curved surface is a concave surface, wherein the center of the opening 502 has a depth 503a sinking from the side of the opening 502. The depth 503a of the concave surface can be between 15 μm and 1000 μm. The depth 503a of the concave surface is proportional to the diameter of the wafer 504 supported by the wafer carrier 50, and a ratio between the diameter of the wafer 504 and the depth 503a of the concave surface is between 7 and 125. When the epitaxial layer is formed on the growth substrate to form the wafer 504 at high temperature, the wafer 504 is bowed easily. The larger the diameter of the wafer 504 is, the more easily bowed the wafer 504 is. Thus, the depth 503a of the concave surface is increased accompanied with the increase of the diameter of the wafer 504. In the embodiment, the diameter of the wafer 504 is 2 in, and the depth 503a of the concave surface of the supporting body 500 can be between 15 μm and 65 μm. In another embodiment, the diameter of the wafer 504 is 4 in, and the depth 503a of the concave surface of the supporting body 500 can be between 15 μm and 160 μm. In another embodiment, the diameter of the wafer 504 is 6 in, and the depth 503a of the concave surface of the supporting body 500 can be between 15 μm and 400 μm. If the diameter of the wafer 504 is 8 in, the depth 503a of the concave surface of the supporting body 500 can be between 15 μm and 1000 μm.

Because the lattice constants or the thermal expansion coefficients of the epitaxial layer and the growth substrate are different from each other, the warp degree and the warp shape of the wafer are different in different temperature regions. When the bow shape of the wafer is a concave surface, the wafer carrier 50 having the concave surface is preferably provided, which results in more even temperature distribution across the wafer surface, and more even distribution of the light-emitting wavelength of the light-emitting layer across the whole wafer.

In accordance with the second embodiment of the present application, the wafer carrier 50 further comprises the plurality of supporting rods 505 formed around the periphery of the supporting body 500. In the embodiment, there are at least three supporting rods 505. The top view of the plurality of supporting rods 505 formed around the periphery of the supporting body 500 can be referred to FIG. 6. FIG. 6 illustrates a top view of a wafer carrier 60 in accordance with an embodiment of the present application. As illustrated in FIG. 6, there are at least three supporting rods 605, and the plurality of supporting rods 605 is formed around the periphery of the supporting body 600.

A top view of each supporting rod 505 can be referred to FIG. 7. FIG. 7 illustrates a top view of each supporting rod 704 of a wafer carrier 701 in accordance with an embodiment of the present application. Each supporting rod 704 comprises a first side 702 and a plurality of second sides 703, wherein the first side 702 comprises a first arc surface having a first curvature radius, and each of the plurality of second sides 703 comprises a second arc surface having a second curvature radius, wherein the second curvature radius is not equal to the first curvature radius.

As illustrated in FIG. 5A, each of the plurality of supporting rods 505 comprises a height 505a smaller than the height 501 of the supporting body 500. The height 505a of each of the plurality of supporting rods 505 is larger than the depth 503a of the concave surface of the supporting body 500. The height 505a of the supporting rod 505 can be between 15 µm and 1000 µm. The material of the plurality of supporting rods 505 comprises composite material, such as ceramic material; semiconductor material, such as boron nitride (BN) or silicon carbide (SiC); conductive material, such as graphite or metal, wherein the metal comprises molybdenum (Mo), tungsten (W), titanium (Ti), zirconium (Zr) or the combination thereof; or non-conductive material, such as quartz.

Figure 5B:
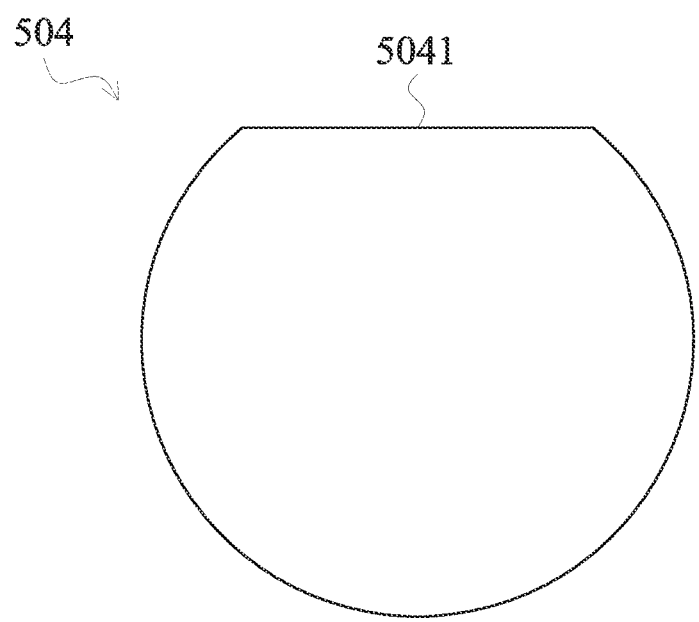
FIG. 5B illustrates a top view of a wafer in accordance with a second embodiment of the present application.

FIG. 5B illustrates a top view of the wafer 504 in accordance with an embodiment of the present application. The wafer 504 comprises a flat edge 5041. As illustrated in FIG. 5A, after the wafer 504 is supported by the plurality of supporting rods 505, the wafer 504 cannot directly contact with the bottom surface 503 of the wafer carrier 50. Thus, it is not easy to heat the wafer 504, especially the flat edge 5041, and that impacts the light-emitting wavelength emitted from the light-emitting layer of the wafer 504. This phenomenon is more pronounced accompanied with an increase of the diameter of the wafer 504. FIG. 8A illustrates the top view of the wafer carrier 80 comprising the flat edge 803. FIG. 8B illustrates the top view of the wafer carrier 80 comprising the flat edge 803 and the wafer 804 comprising a flat edge 8041. As illustrated in FIG. 8A and FIG. 8B, when the wafer carrier 80 comprises the flat edge 803, a gap 803a between a flat edge 8041 of a wafer 804 and the flat edge 803 of the wafer carrier 80 is reduced, and the heating uniformity is improved. In the embodiment illustrated in FIG. 8B, when the wafer carrier 50 is used to support the wafer 504 having a diameter of 4 in or above and the flat edge 5041, the wafer carrier 50 preferably comprises a flat edge.

A manufacturing method of a wafer carrier is provided in accordance with an embodiment of the present application. The method comprises forming an epitaxial layer on a growth substrate to form a wafer structure; measuring a curvature radius of the wafer structure; and providing the wafer carrier as illustrated in the first embodiment or the second embodiment in accordance with the curvature radius of the wafer structure. When the warp shape of the wafer structure is a convex shape, a wafer carrier comprising a convex surface and a plurality of supporting rods is preferably provided, wherein the convex surface comprises a height and the range of the height can be referred to the first embodiment of the present application. When the warp shape of the wafer structure is a concave shape, a wafer carrier comprising a concave surface and a plurality of supporting rods is preferably provided, wherein the concave surface comprises a depth and the range of the depth can be referred to the second embodiment of the present application. The height of the convex surface and/or the depth of the concave surface are proportional to the diameter of the wafer. There are at least three supporting rods. The material of the epitaxial layer comprises an element selected from a group consisting of Gallium (Ga), aluminum (Al), indium (In), phosphorus (P), nitrogen (N), zinc (Zn), cadmium (Cd) and selenium (Se).

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A wafer carrier comprising:
   a supporting body having an opening therein, wherein said opening in said supporting body has a concave sidewall and a bottom surface in said supporting body which is curved in cross section;
   a plurality of supporting rods configured to support and contact a wafer received in said opening and to displace said wafer from the bottom surface of the opening in said supporting body; wherein one of said supporting rods has an end for contacting and supporting said wafer; and wherein when viewing from a top view of the wafer carrier, one of said supporting rods has a base lining on the concave sidewall of said opening in said supporting body, a first concave side opposite to the base and two second concave sides connecting the base and the first concave side.

2. The wafer carrier of claim 1, wherein the plurality of supporting rods are in contact with the concave sidewall of the opening for receiving a semiconductor wafer in the supporting body and supporting the semiconductor wafer on its outer periphery.

3. The wafer carrier as claimed in claim 1, wherein the shape of the opening is approximately circular from a top view.

4. The wafer carrier as claimed in claim 3, wherein the shape of the opening further comprises a flat edge from a top view.

5. The wafer carrier as claimed in claim 1, wherein the bottom surface comprises an edge and a center.

6. The wafer carrier as claimed in claim 5, wherein the center of the bottom surface has a height greater than a height of the edge of the bottom surface.

7. The wafer carrier as claimed in claim 5, wherein the center of the bottom surface has a height smaller than a height of the edge of the bottom surface.

8. The wafer carrier as claimed in claim 5, wherein a height difference between heights of the center and the edge of the bottom surface is between 15 μm and 1000 μm.

9. The wafer carrier as claimed in claim 8, wherein the opening can accommodate the wafer having a diameter between 2 inches and 8 inches.

10. The wafer carrier as claimed in claim 9, wherein the height difference is proportional to a diameter of the wafer.

11. The wafer carrier as claimed in claim 1, wherein one of the plurality of supporting rods comprises two different arcs with two different curvatures.

12. The wafer carrier as claimed in claim 1, wherein the plurality of supporting rods comprises at least three supporting rods.

13. The wafer carrier as claimed in claim 1, wherein each of the plurality of supporting rods comprises a height smaller than the height of the supporting body.

14. The wafer carrier as claimed in claim 13, wherein the plurality of supporting rods is above the bottom surface.

15. The wafer carrier as claimed in claim 1, wherein the material of the supporting body or the supporting rod comprises composite material, semiconductor material, conductive material or non-conductive material.

16. A manufacturing method of a wafer carrier, comprising:
   forming an epitaxial layer on a wafer to form a wafer structure;
   measuring a curvature radius of the wafer structure; and
   providing the wafer carrier as claimed in claim 1 in accordance with the curvature radius of the wafer structure.

\* \* \* \* \*